(12) United States Patent
Takamine

(10) Patent No.: US 9,184,728 B2
(45) Date of Patent: Nov. 10, 2015

(54) ELASTIC-WAVE FILTER DEVICE

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 134 days.

(21) Appl. No.: 14/096,046

(22) Filed: Dec. 4, 2013

(65) Prior Publication Data

US 2014/0176257 A1   Jun. 26, 2014

Related U.S. Application Data

(63) Continuation of application No. PCT/JP2012/053750, filed on Feb. 17, 2012.

(30) Foreign Application Priority Data

Jun. 9, 2011   (JP) .................................. 2011-129173

(51) Int. Cl.
*H03H 9/64*   (2006.01)
*H03H 9/72*   (2006.01)
*H03H 9/00*   (2006.01)
*H03H 9/05*   (2006.01)

(52) U.S. Cl.
CPC .............. *H03H 9/725* (2013.01); *H03H 9/0028* (2013.01); *H03H 9/0576* (2013.01); *H03H 9/6433* (2013.01); *H03H 9/6493* (2013.01)

(58) Field of Classification Search
CPC . H03H 9/0028; H03H 9/0066; H03H 9/0071; H03H 9/0085; H03H 9/64; H03H 9/6423; H03H 9/6433; H03H 9/6476; H03H 9/6493; H03H 9/725; H03H 9/0576

USPC .......................................... 333/133, 193, 195
See application file for complete search history.

(56) References Cited

U.S. PATENT DOCUMENTS 5,581,141 A    12/1996  Yamada et al.
6,107,899 A *   8/2000  Taguchi et al. ............... 333/193
(Continued)

FOREIGN PATENT DOCUMENTS

JP   05-007125 A   1/1993
JP   08-051334 A   2/1996
(Continued)

OTHER PUBLICATIONS

The Derwent Abstract for JP 10-190406, published Jul. 21, 1998, two pages.*

(Continued)

*Primary Examiner* — Barbara Summons
(74) *Attorney, Agent, or Firm* — Keating & Bennett, LLP

(57) ABSTRACT

An elastic-wave filter device includes a reception filter section including a longitudinally coupled resonator-type elastic-wave filter section that has a balanced-to-unbalanced conversion function and has improved common-mode isolation characteristics. Among IDT electrodes of a filter section, each of the other comb-shaped electrode of a first IDT electrode including a pair of comb-shaped electrodes, one of which is connected to a first balanced-signal terminal, and the other comb-shaped electrode of a second IDT electrode including a pair of comb-shaped electrodes, one of which is connected to a second balanced-signal terminal, is connected to one of ground electrodes that are provided on a piezoelectric substrate. Inductors are provided on the piezoelectric substrate, and each inductor is connected between the other comb-shaped electrode of one of the first and second IDT electrodes and one of the ground electrodes.

11 Claims, 7 Drawing Sheets

(56) References Cited

U.S. PATENT DOCUMENTS

| | | | |
|---|---|---|---|
| 6,967,427 B2* | 11/2005 | Yata | 310/313 D |
| 8,319,585 B2* | 11/2012 | Miyake | 333/193 |
| 8,362,852 B2* | 1/2013 | Tanaka | 333/133 |
| 2005/0242903 A1 | 11/2005 | Inoue et al. | |
| 2008/0284540 A1 | 11/2008 | Nishihara et al. | |
| 2009/0315640 A1 | 12/2009 | Umeda et al. | |
| 2010/0066461 A1* | 3/2010 | Yonekura | 333/4 |
| 2010/0109802 A1 | 5/2010 | Tanaka | |
| 2011/0193654 A1 | 8/2011 | Miyake | |

FOREIGN PATENT DOCUMENTS

| | | | |
|---|---|---|---|
| JP | 10-107574 | * | 4/1998 |
| JP | 10-190406 | * | 7/1998 |
| JP | 2005-318307 A | | 11/2005 |
| JP | 2008-271230 A | | 11/2008 |
| JP | 2010-010832 A | | 1/2010 |
| JP | 2010-109694 A | | 5/2010 |
| WO | 2010/052969 A1 | | 5/2010 |
| WO | 2011/040332 A1 | | 4/2011 |

OTHER PUBLICATIONS

Official Communication issued in corresponding German Patent Application No. 11 2012 002 389.7, mailed on Apr. 29, 2014.

Official Communication issued in International Patent Application No. PCT/JP2012/053750, mailed on Apr. 17, 2012.

* cited by examiner

ELASTIC-WAVE FILTER DEVICE

BACKGROUND OF THE INVENTION

1. Field of the Invention

The present invention relates to an elastic-wave filter device, and, particularly, an elastic-wave filter device that includes a longitudinally coupled resonator-type elastic-wave filter section which has a balanced-to-unbalanced conversion function.

2. Description of the Related Art

Recently, elastic-wave filter devices that utilize an elastic wave such as a surface acoustic wave or a boundary acoustic wave at an RF stage of mobile phones have been used. The elastic-wave filter devices have been required to have not only a low insertion loss in the passband, but also excellent isolation characteristics in terms of electrical characteristics, a balanced-to-unbalanced conversion function in terms of a function, and so forth.

For example, in Japanese Unexamined Patent Application Publication No. 2010-109694, an elastic-wave duplexer in which a reception filter section is constituted by a longitudinally coupled resonator-type elastic-wave filter section that has the balanced-to-unbalanced conversion function is described. In the elastic-wave duplexer described in Japanese Unexamined Patent Application Publication No. 2010-109694, an elastic-wave resonator constituting a shunt trap is connected between a node between a reception filter section, which is constituted by a longitudinally coupled resonator-type elastic-wave filter section, and a first balanced-signal terminal and a node between the reception filter section and a second balanced-signal terminal.

However, the elastic-wave duplexer described in Japanese Unexamined Patent Application Publication No. 2010-109694 has a problem that it is difficult to sufficiently improve the common-mode isolation characteristics.

SUMMARY OF THE INVENTION

Preferred embodiments of the present invention provide an elastic-wave filter device that achieves improved common-mode isolation characteristics and includes a reception filter section including a longitudinally coupled resonator-type elastic-wave filter section that has a balanced-to-unbalanced conversion function.

An elastic-wave filter device according to a preferred embodiment of the present invention includes an antenna terminal, first and second balanced-signal terminals, and a reception filter section. The reception filter section is connected between the antenna terminal and the first and second balanced-signal terminals. The reception filter section preferably includes a longitudinally coupled resonator-type elastic-wave filter section. The longitudinally coupled resonator-type elastic-wave filter section includes a piezoelectric substrate and a plurality of IDT electrodes. The plurality of IDT electrodes are provided on the piezoelectric substrate. Each of the plurality of IDT electrodes includes a pair of comb-shaped electrodes. Among the plurality of IDT electrodes, each of the other comb-shaped electrode of a first IDT electrode including the pair of comb-shaped electrodes one of which is connected to the first balanced-signal terminal and the other comb-shaped electrode of a second IDT electrode including the pair of comb-shaped electrodes one of which is connected to the second balanced-signal terminal is connected to a corresponding one of a plurality of ground electrodes that are provided on the piezoelectric substrate.

An elastic-wave filter device according to a preferred embodiment of the present invention further includes a first elastic-wave resonator, a second elastic-wave resonator, and inductors. The first elastic-wave resonator includes the piezoelectric substrate and an IDT electrode that is provided on the piezoelectric substrate and that is connected between a node between the reception filter section and the first balanced-signal terminal and a corresponding one of the ground electrodes. The second elastic-wave resonator includes the piezoelectric substrate and an IDT electrode that is provided on the piezoelectric substrate and that is connected between a node between the reception filter section and the second balanced-signal terminal and a corresponding one of the ground electrodes. The inductors are provided on the piezoelectric substrate. Each of the inductors is connected between the other comb-shaped electrode of a corresponding one of the first and second IDT electrodes and a corresponding one of the ground electrodes.

In an elastic-wave filter device according to a preferred embodiment of the present invention, the elastic-wave filter device includes a filter chip that includes the longitudinally coupled resonator-type elastic-wave filter section, the first and second elastic-wave resonators, and the inductors, and a wiring substrate on which the filter chip is mounted.

According to various preferred embodiments of the present invention, in the elastic-wave filter device that includes the reception filter section including the longitudinally coupled resonator-type elastic-wave filter section that has a balanced-to-unbalanced conversion function, an improvement in the common-mode isolation characteristics is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
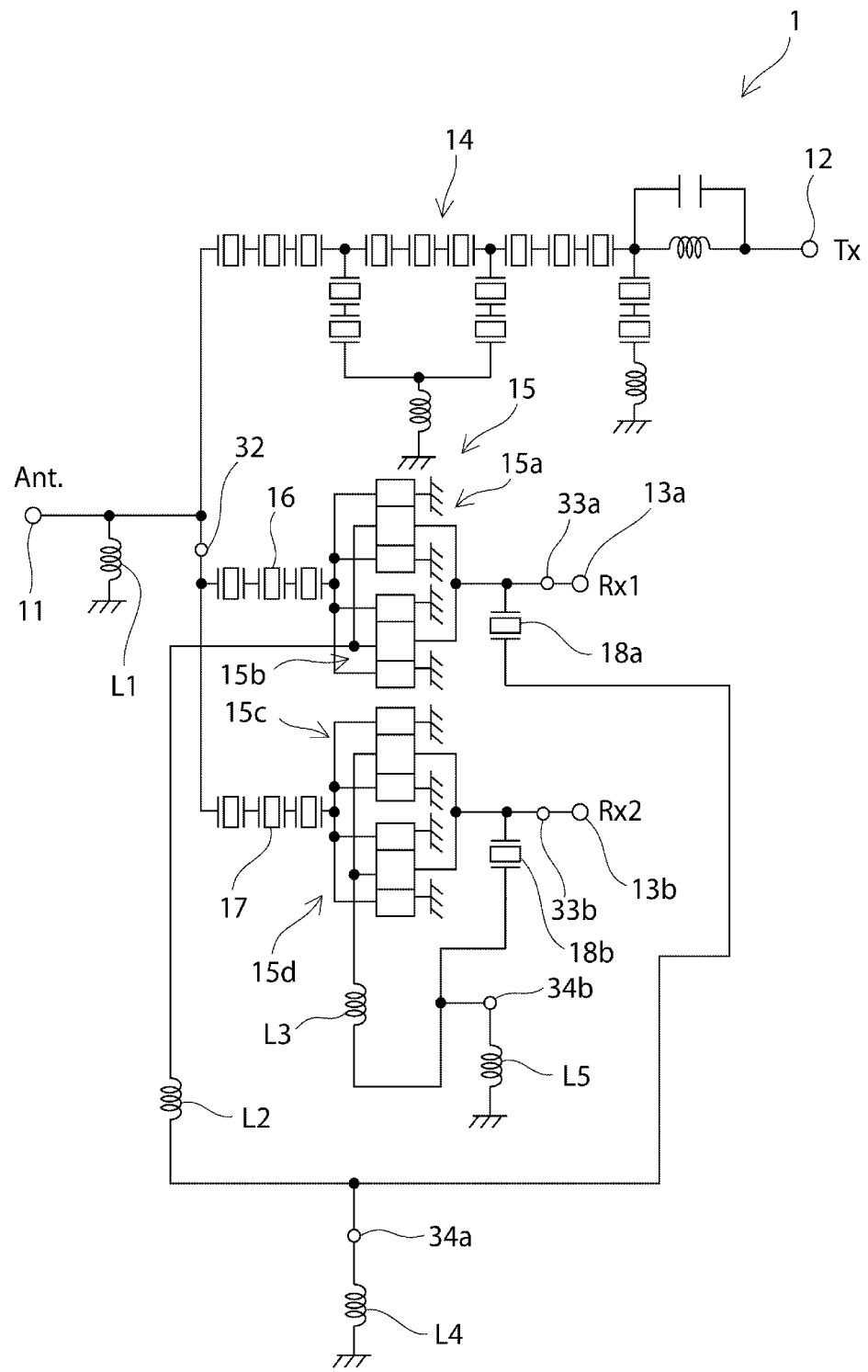
FIG. 1 is a schematic circuit diagram of an elastic-wave duplexer according to a preferred embodiment of the present invention.

Hereinafter, examples of preferred embodiments of the present invention will be described. However, the preferred embodiments described below are only examples. The present invention is not limited in any way to the preferred embodiments described below.

Furthermore, in the individual drawings that are referred to in the description of the preferred embodiments or the like, components having the same or substantially the same functions are denoted by the same reference numerals. Moreover, the drawings that are referred to in the description of preferred embodiments or the like preferably are schematic drawings, and, the dimension ratio or the like of an object illustrated in each of the drawings may be different from the dimension ratio or the like of the object in reality. The dimension ratios or the like of the object in the individual drawings may be different from one another. The specific dimension ratio or the like of the object should be determined with consideration of a description give below.

Figure 2:
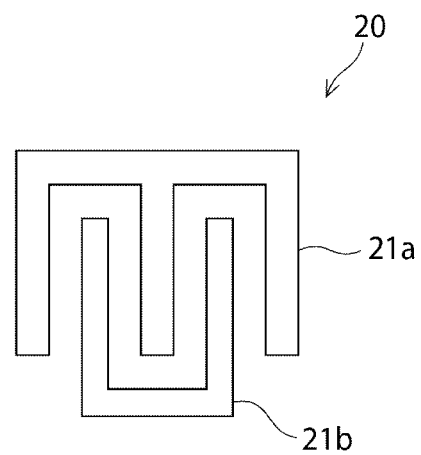
FIG. 2 is a schematic plan view of an IDT electrode.
Figure 3:
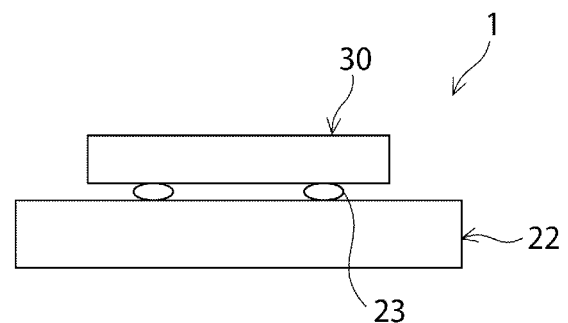
FIG. 3 is a schematic side view of the elastic-wave duplexer according to a preferred embodiment of the present invention.
Figure 4:
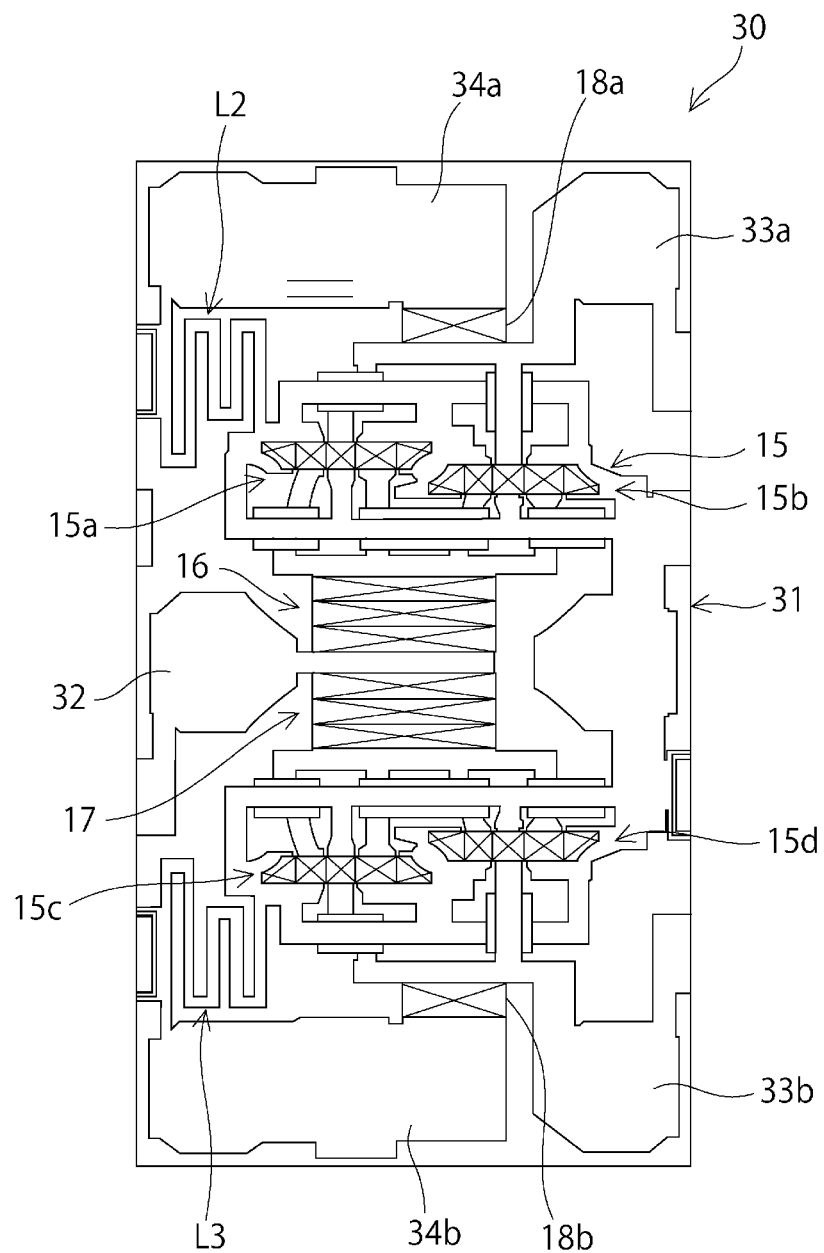
FIG. 4 is a schematic perspective plan view of a filter chip in a preferred embodiment of the present invention.

FIG. 1 is a schematic circuit diagram of an elastic-wave duplexer according to a preferred embodiment of the present preferred embodiment. FIG. 2 is a schematic plan view of an IDT electrode. FIG. 3 is a schematic side view of the elastic-wave duplexer according to the present preferred embodiment. FIG. 4 is a schematic perspective plan view of a filter chip in the present preferred embodiment.

In the present preferred embodiment, as an elastic-wave filter device according to the present invention, an elastic-wave duplexer 1 that utilizes an elastic wave such as a surface acoustic wave or a boundary acoustic wave will be described as a non-limiting example. Specifically, the elastic-wave duplexer 1 preferably is a balanced-type duplexer that has a balanced-to-unbalanced conversion function on a reception side, and, more specifically, preferably is a balanced-type duplexer used for UMTS-Band 2, for example. Note that the transmission frequency band of UMTS-Band 2 is from 1850 MHz to 1910 MHz, and the reception frequency band is from 1930 MHz to 1990 MHz. In the elastic-wave duplexer 1, an impedance at reception-side balanced-signal terminals 13a and 13b preferably is about 100Ω, for example.

Next, an electric configuration of the elastic-wave duplexer 1 will be described in detail with reference to FIGS. 1 and 2.

The elastic-wave duplexer 1 includes an antenna terminal 11, a transmission-side signal terminal 12, and the first and second reception-side balanced-signal terminals 13a and 13b. A transmission filter section 14 is connected between the antenna terminal 11 and the transmission-side signal terminal 12. In the present preferred embodiment, the transmission filter section 14 preferably is constituted by a ladder-type elastic-wave filter section. Note that the transmission filter section may be constituted by a filter section other than a ladder-type elastic-wave filter section, for example, a longitudinally coupled resonator-type elastic-wave filter section.

A reception filter section 15 is connected between the antenna terminal 11 and the first and second reception-side balanced-signal terminals 13a and 13b. An inductor L1 used to perform impedance matching is connected between a node between the reception filter section 15 and the transmission filter section 14 and the antenna terminal 11 and the ground potential.

The reception filter section 15 preferably includes a longitudinally coupled resonator-type elastic-wave filter section. Specifically, the longitudinally coupled resonator-type elastic-wave filter section that constitutes the reception filter section preferably includes first to fourth longitudinally coupled resonator-type element units 15a to 15d. The first and second longitudinally coupled resonator-type element units 15a and 15b are connected in parallel between the antenna terminal 11 and the first reception-side balanced-signal terminal 13a. A plurality of elastic-wave resonators 16 are connected between the first and second longitudinally coupled resonator-type element units 15a and 15b and the antenna terminal 11. Meanwhile, an elastic-wave resonator (a first elastic-wave resonator) 18a is connected between a node between the first and second longitudinally coupled resonator-type element units 15a and 15b and the first reception-side balanced-signal terminal 13a and the ground potential.

The third and fourth longitudinally coupled resonator-type element units 15c and 15d are connected in parallel between the antenna terminal 11 and the second reception-side balanced-signal terminal 13b. A plurality of elastic-wave resonators 17 are connected between the third and fourth longitudinally coupled resonator-type element units 15c and 15d and the antenna terminal 11. Meanwhile, an elastic-wave resonator (a second elastic-wave resonator) 18b is connected between a node between the third and fourth longitudinally coupled resonator-type element units 15c and 15d and the second reception-side balanced-signal terminal 13b and the ground potential.

Each of the first to fourth longitudinally coupled resonator-type element units 15a to 15d includes a plurality of IDT electrodes that are arranged along an elastic-wave propagation direction. Specifically, each of the first to fourth longitudinally coupled resonator-type element units 15a to 15d includes three IDT electrodes that are arranged along the elastic-wave propagation direction, and includes reflectors on both sides of the three IDT electrodes in the elastic-wave propagation direction. Each of the IDT electrodes constituting the first to fourth longitudinally coupled resonator-type element units 15a to 15d is constituted by an IDT electrode 20 that includes a pair of comb-shaped electrodes 21a and 21b which are inserted into each other, as illustrated in FIG. 2. Among the three IDT electrodes which are arranged along the elastic-wave propagation direction, one of the pair of comb-shaped electrodes of each of IDT electrodes that are located on both sides in the elastic-wave propagation direction is connected to the antenna terminal 11, and the other comb-shaped electrode is connected to the ground potential. One of the pair of comb-shaped electrodes of the IDT electrode that is located in the center in the elastic-wave propagation direction is connected to the ground potential, and the other comb-shaped electrode is connected to the first reception-side balanced-signal terminal 13a or the second reception-side balanced-signal terminal 13b.

Next, a specific configuration of the elastic-wave duplexer 1 will be described with reference to FIGS. 3 and 4. The elastic-wave duplexer 1 includes a filter chip 30 and a wiring substrate 22. The filter chip 30 is mounted on the wiring substrate 22. Specifically, the filter chip 30 is mounted using flip-chip bounding via bumps 23 on the wiring substrate 22.

The filter chip 30 includes a piezoelectric substrate 31, as illustrated in FIG. 4. In the present preferred embodiment, an example is described, in which the piezoelectric substrate 31 preferably is constituted by a 40±5° Y-cut X-propagation LiTaO$_3$ substrate, for example. However, in the present invention, the type of piezoelectric substrate is not particularly limited. The piezoelectric substrate can be constituted by, for example, an LiNbO$_3$ substrate or a crystal substrate.

On the piezoelectric substrate 31, an electrode pad 32 that is connected to the antenna terminal 11, IDT electrodes that constitute multiple elastic-wave resonators 16 and 17, the longitudinally coupled resonator-type elastic-wave filter section which constitutes the reception filter section 15, and the elastic-wave resonators 18a and 18b, electrode pads 33a and 33b that are connected to the first and second reception-side balanced-signal terminals 13a and 13b, respectively, and the ground electrodes 34a and 34b are provided. Among the IDT electrodes constituting the first to fourth longitudinally coupled resonator-type element units 15a to 15d, the other comb-shaped electrode of each of the IDT electrodes that are each located in the center in the elastic-wave propagation direction, and that each include the pair of comb-shaped electrodes one of which is connected to a corresponding one of the first reception-side balanced-signal terminal 13a and the second reception-side balanced-signal terminal 13b and one of a pair of comb-shaped electrodes of an IDT electrode constituting a corresponding one of the elastic-wave resonators 18a and 18b are connected to a corresponding one of the ground electrodes 34a and 34b. The ground electrodes 34a and 34b are connected to the ground potential via wiring (not illustrated) that is provided in the wiring substrate 22. Therefore, in reality, as illustrated in FIG. 1, each of residual inductors L4 and L5 that are defined by the wiring disposed in the wiring substrate 22 is connected between a corresponding one of the ground electrodes 34a and 34b and the ground potential. The inductance values of the residual inductors are determined in accordance with the length or layout of the wiring disposed in the wiring substrate 22. Usually, in terms of miniaturization of the elastic-wave duplexer 1, the wiring is provided with a high wiring density, and the size of the wiring substrate 22 is also limited to the minimum size needed. Therefore, it is difficult to adjust the size of the residual inductors L4 and L5 by changing the layout of the wiring.

Furthermore, inductors L2 and L3 are provided on the piezoelectric substrate 31. In the present preferred embodiment, the inductors L2 and L3 are constituted by electrodes preferably arranged in a zigzag configuration, for example. Each of the inductors L2 and L3 is connected between, among the IDT electrodes constituting the first to fourth longitudinally coupled resonator-type element units 15a to 15d, the other comb-shaped electrode of a corresponding one of the IDT electrodes that each include the pair of comb-shaped electrodes one of which is connected to a corresponding one of the first reception-side balanced-signal terminal 13a and the second reception-side balanced-signal terminal 13b and a corresponding one of the ground electrodes 34a and 34b.

Note that, in the description given below, "among the IDT electrodes constituting the first to fourth longitudinally coupled resonator-type element units 15a to 15d, IDT electrodes that each include the pair of comb-shaped electrodes one of which is connected to the first reception-side balanced-signal terminal 13a or the second reception-side balanced-signal terminal 13b" are referred to as "output IDT electrodes".

In the elastic-wave duplexer 1, an attenuation pole is defined by an LC resonance circuit that includes capacitors defined by the output IDT electrodes, capacitors defined by the elastic-wave resonators 18a and 18b, and the residual inductors L4 and L5. In addition, in the elastic-wave duplexer 1, the inductors L2 and L3 are arranged so that the attenuation pole is located, for example, within a transmission frequency band (a passband of the transmission filter section 14). Accordingly, in the elastic-wave duplexer 1, common-mode isolation characteristics (transmission→reception) in the transmission frequency band are improved.

Note that, the capacitance generated by the elastic-wave resonators 18a and 18b is typically different from the capacitance generated by the output IDT electrodes. Thus, for example, in the case where the inductors L2 and L3 are not provided, the frequency position of an attenuation pole defined by the elastic-wave resonators 18a and 18b and the residual inductors L4 and L5 and the frequency position of an attenuation pole defined by the output IDT electrodes and the residual inductors L4 and L5 are different from each other. Therefore, it is not possible to provide an attenuation pole having a large attenuation. In contrast, in the present preferred embodiment, the frequency position of the attenuation pole defined by the output IDT electrodes and the residual inductors L4 and L5 is adjusted by the inductors L2 and L3 that are connected between the output IDT electrodes and the ground electrodes 34a and 34b, respectively. Therefore, the frequency position of the attenuation pole defined by the elastic-wave resonators 18a and 18b and the residual inductors L4 and L5 and the frequency position of the attenuation pole defined by the output IDT electrodes and the residual inductors L4 and L5 can match. Accordingly, an attenuation pole having a larger attenuation is provided. As a result, the common-mode isolation characteristics is more effectively improved.

Hereinafter, this effect will be described in more detail on the basis of specific examples. Note that, in the description of Examples and Comparative Example given below, components having functions that are the same or substantially the same as the functions in the foregoing preferred embodiments are denoted by the same reference numerals.

Example 1

A surface-acoustic-wave duplexer having a configuration that is the same or substantially the same as that of the elastic-wave duplexer 1 is produced. Note that, in Example 1, each of the inductance values of the inductors L2 and L3 is 0.3 nH.

Example 2

Figure 5:
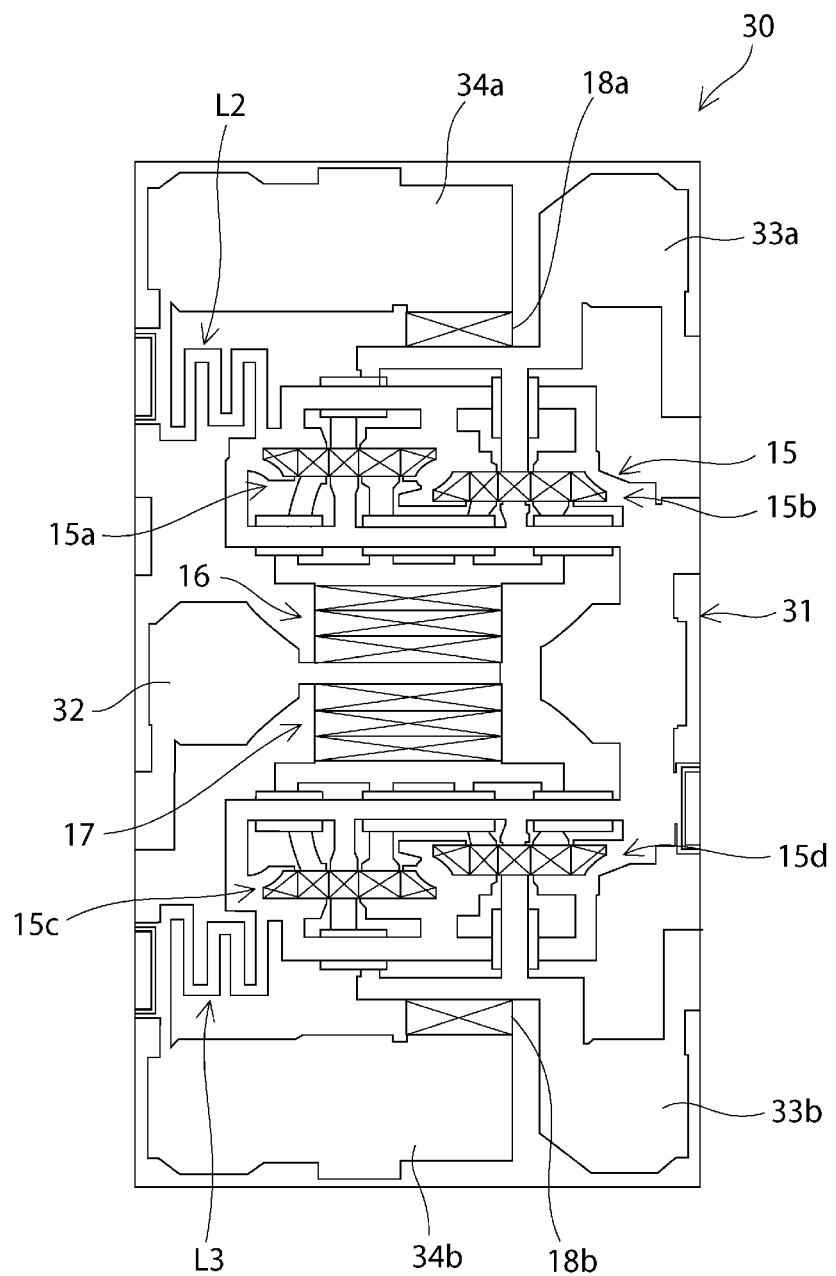
FIG. 5 is a schematic perspective plan view of a filter chip in Example 2.

A surface-acoustic-wave duplexer is produced as in Example 1 except that a filter chip has a configuration illustrated in FIG. 5 and that each of the inductance values of the inductors L2 and L3 is 0.2 nH.

Example 3

Figure 6:
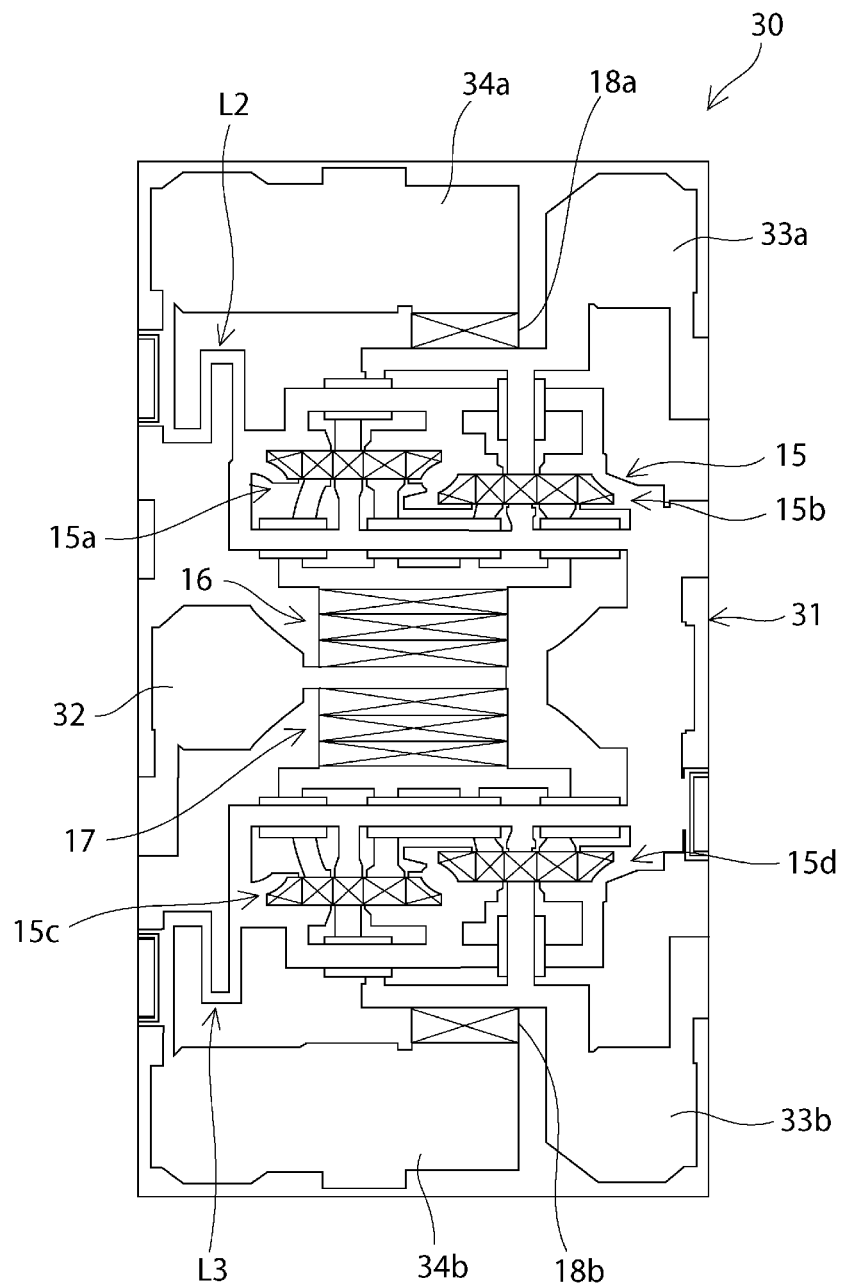
FIG. 6 is a schematic perspective plan view of a filter chip in Example 3.

A surface-acoustic-wave duplexer is produced as in Example 1 except that a filter chip has a configuration illustrated in FIG. 6 and that each of the inductance values of the inductors L2 and L3 is 0.1 nH.

Comparative Example

Figure 7:
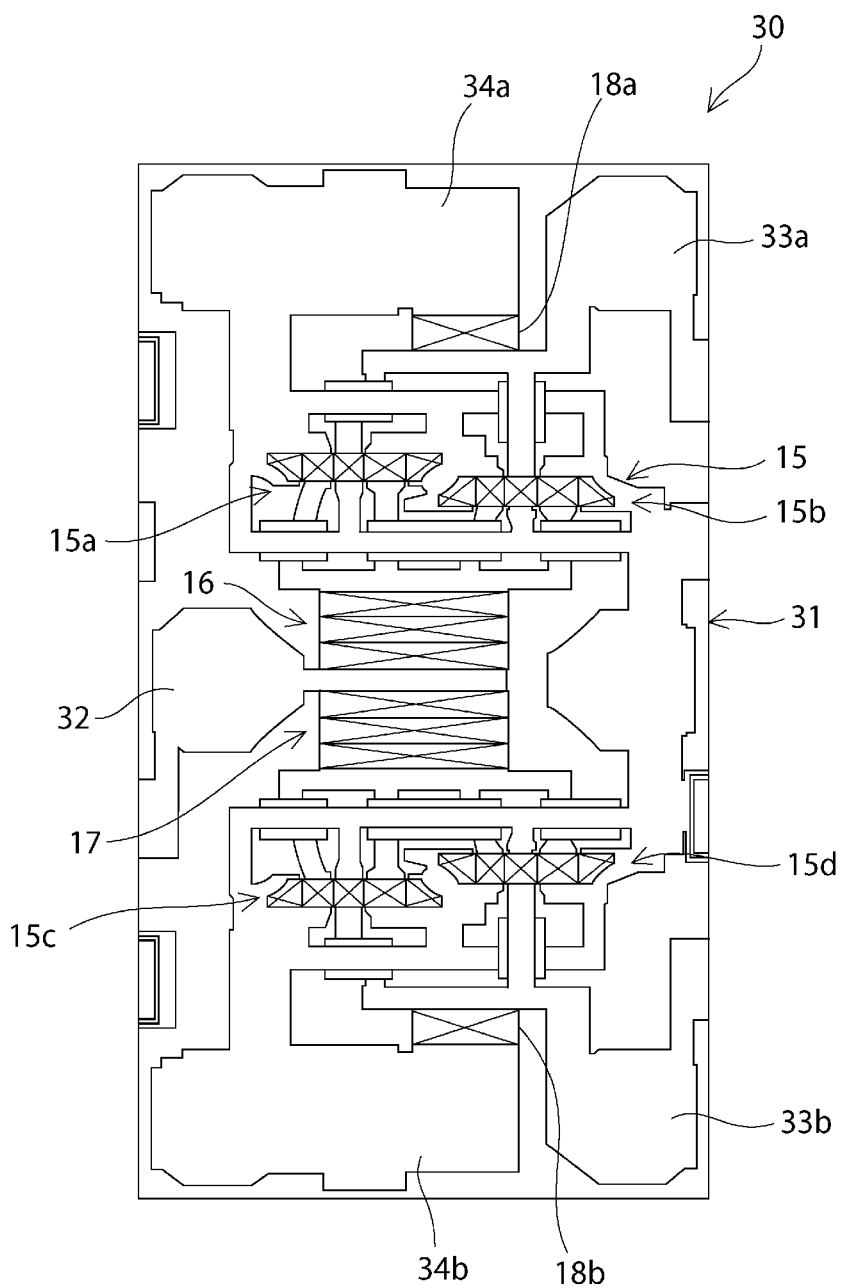
FIG. 7 is a schematic perspective plan view of a filter chip in Comparative Example.

A surface-acoustic-wave duplexer is produced as in Example 1 except that a filter chip has a configuration illustrated in FIG. 7 and that the inductors L2 and L3 are not provided.

Figure 8:
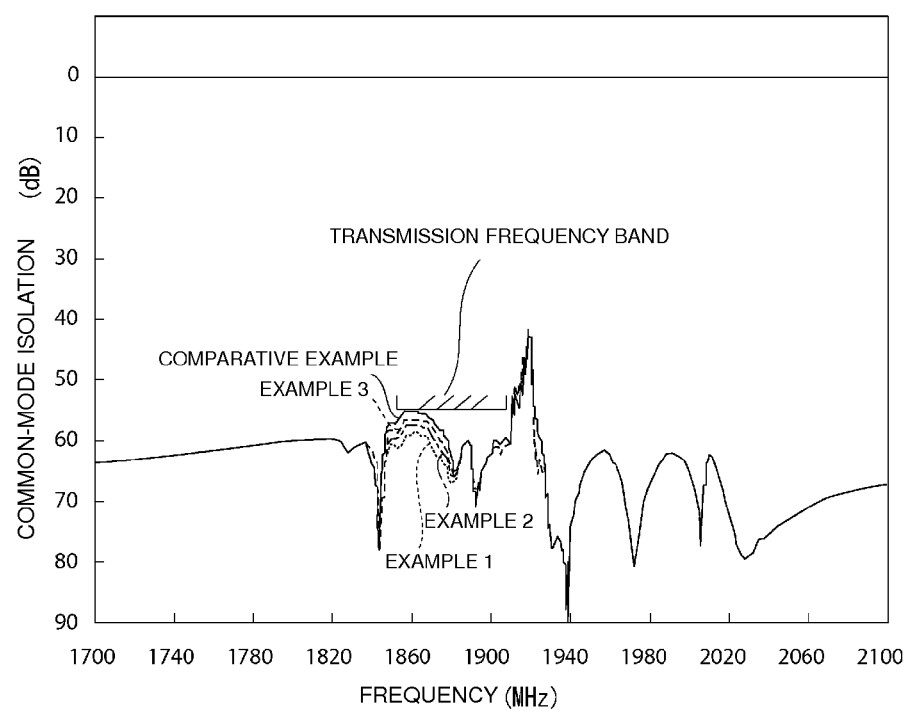
FIG. 8 is a graph illustrating common-mode isolation characteristics of surface-acoustic-wave duplexers according to Examples 1 to 3 and Comparative Example.

In FIG. 8, common-mode isolation characteristics of the surface-acoustic-wave duplexers according to Examples 1 to 3 and Comparative Example are illustrated. In FIG. 8, the dotted line represents Example 1, the alternate long and short dash line represents Example 2, the broken line represents Example 3, and the solid line represents Comparative Example. Furthermore, common-mode isolation in a Tx band (1850 MHz to 1910 MHz) of each of the surface-acoustic-wave duplexers according to Examples 1 to 3 and Comparative Example is as follows.

Example 1 . . . 58.8 dB
Example 2 . . . 57.3 dB
Example 3 . . . 56.5 dB
Comparative Example . . . 55.2 dB It is understandable from the results described above that the common-mode isolation characteristics are improved by providing each of the inductors L2 and L3 between a corresponding one of the ground electrodes 34a and 34b and the corresponding output IDT electrodes.

Note that the present invention includes various additional preferred embodiments that are not described herein. For example, the elastic-wave filter device according to the present invention may be a boundary-acoustic-wave filter device that utilizes a boundary acoustic wave.

The elastic-wave filter device according to various preferred embodiments of the present invention may be a device including a single filter section, or may be a device including three or more filter sections. The elastic-wave filter device according to various preferred embodiments of the present invention may be, for example, a triplexer.

In preferred embodiments of the present invention, each of the longitudinally coupled resonator-type elastic-wave filter sections may be constituted by five, seven, nine, or more IDT electrodes that are arranged along the elastic-wave propagation direction, for example.

As described above, the present invention includes various preferred embodiments that are not described herein. Accordingly, the technical scope of the present invention should be defined only by the matters defining the present invention according to the scope of claims reasonably understood from the above description.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic-wave filter device comprising:
    an antenna terminal;
    first and second balanced-signal terminals; and
    a reception filter section that is connected between the antenna terminal and the first and second balanced-signal terminals; wherein
    the reception filter section includes a longitudinally coupled resonator elastic-wave filter section that includes a piezoelectric substrate and a plurality of IDT electrodes provided on the piezoelectric substrate and each of which includes a pair of comb-shaped electrodes;
    among the plurality of IDT electrodes, a first comb-shaped electrode of a first IDT electrode including the pair of comb-shaped electrodes, one of which is connected to the first balanced-signal terminal, is connected to a corresponding first one of a plurality of ground electrodes that are provided on the piezoelectric substrate, and a first comb-shaped electrode of a second IDT electrode including the pair of comb-shaped electrodes, one of which is connected to the second balanced-signal terminal, is connected to a different corresponding second one of the ground electrodes provided on the piezoelectric substrate; and
    the elastic-wave filter device further comprises:
        a first elastic-wave resonator that includes the piezoelectric substrate and an IDT electrode which is provided on the piezoelectric substrate and which is connected between a node between the reception filter section and the first balanced-signal terminal and the corresponding first one of the ground electrodes;
        a second elastic-wave resonator that includes the piezoelectric substrate and an IDT electrode which is provided on the piezoelectric substrate and which is connected between a node between the reception filter section and the second balanced-signal terminal and the corresponding second one of the ground electrodes; and
        inductors which are provided on the piezoelectric substrate and each of which is connected between the first comb-shaped electrode of a corresponding one of the first and second IDT electrodes and the corresponding first and second ones of the ground electrodes.

2. The elastic-wave filter device according to claim 1, further comprising:
    a filter chip that includes the longitudinally coupled resonator elastic-wave filter section, the first and second elastic-wave resonators, and the inductors; and
    a wiring substrate on which the filter chip is mounted.

3. The elastic-wave filter device according to claim 1, wherein the elastic-wave filter device is configured to use a surface acoustic wave or a boundary acoustic wave.

4. The elastic-wave filter device according to claim 1, wherein the longitudinally coupled resonator elastic-wave filter section includes a plurality of longitudinally coupled resonator element units.

5. The elastic-wave filter device according to claim 4, wherein a number of the plurality of longitudinally coupled resonator element units of the longitudinally coupled resonator elastic-wave filter section is four.

6. The elastic-wave filter device according to claim 4, wherein at least two of the plurality of longitudinally coupled resonator element units are connected to each other in parallel.

7. The elastic-wave filter device according to claim 4, wherein each of the plurality of longitudinally coupled resonator element units of the longitudinally coupled resonator elastic-wave filter section includes three IDT electrodes.

8. The elastic-wave filter device according to claim 1, wherein the piezoelectric substrate is one of a $LiTaO_3$ substrate, an $LiNbO_3$ substrate, and a crystal substrate.

9. The elastic-wave filter device according to claim 1, wherein the inductors include electrodes arranged in a zigzag pattern.

10. The elastic-wave filter device according to claim 1, wherein an attenuation pole is defined by an LC resonance circuit that includes capacitors defined by the IDT electrodes, capacitors defined by the first and second elastic-wave resonators, and the inductors.

11. The elastic-wave filter device according to claim 1, wherein the inductors are arranged so that an attenuation pole is located within a transmission frequency band of a transmission filter section.

* * * * *